United States Patent [19]

Farney et al.

[11] 4,053,850

[45] Oct. 11, 1977

[54] MAGNETRON SLOT MODE ABSORBER

[75] Inventors: George Kenneth Farney, Boxford; William Allen Gerard, Andover, both of Mass.

[73] Assignee: Varian Associates, Inc., Palo Alto, Calif.

[21] Appl. No.: 726,088

[22] Filed: Sept. 23, 1976

[51] Int. Cl.[2] .................... H03B 9/10

[52] U.S. Cl. .................... 331/91; 315/39.53; 315/39.77

[58] Field of Search .................... 331/91, 105; 315/39.77, 315/39.53

[56] References Cited

U.S. PATENT DOCUMENTS

| | | | |
|---|---|---|---|
| 2,854,603 | 9/1958 | Collier et al. | 315/39.77 |
| 3,169,211 | 2/1965 | Drexler et al. | 315/39.77 |
| 3,231,781 | 1/1966 | Liscid | 315/39.77 |
| 3,412,284 | 11/1968 | Glenfield | 315/39.77 |
| 3,471,744 | 10/1969 | Pryor | 315/39.77 |
| 3,479,556 | 11/1969 | Cook | 315/39.53 |
| 3,706,910 | 12/1972 | Foreman | 315/39.77 |
| 3,728,650 | 4/1973 | Foreman | 315/39.53 |

*Primary Examiner*—John Kominski

*Attorney, Agent, or Firm*—Stanley Z. Cole; Robert K. Stoddard

[57] ABSTRACT

In a coaxial magnetron the resonant circuit interacting with the electrons is coupled to a stabilizing resonator operating in a mode with circular electric field. The coupling is thru a set of slots in the intervening wall. Undesirable resonances localized in the slots are damped by lossy material at the ends of the slots. Undesirable damping of the cavity mode is prevented by a conducting shield covering exposed area of the lossy material and spaced into the cavity away from the slots.

14 Claims, 4 Drawing Figures

MAGNETRON SLOT MODE ABSORBER

FIELD OF THE INVENTION

The invention pertains to oscillators wherein a resonant circuit interacting with a negative-resistance element such as a stream of electrons is coupled to a high-Q stabilizing resonator by slots in the intervening wall. The coaxial magnetron with a circular-electric-field mode (CEM) cavity is a common example.

PRIOR ART

U.S. Pat. No. 2,854,603 issued Sept. 30, 1958 to R. J. Collier et al., describes a coaxial magnetron in which lossy material is positioned at the end of the coupling slots to selectively damp unwanted modes of oscillation which are accompanied by energy storage in the slots. Such modes have since become known as "slots modes". The lossy material was placed at the ends of the slots to be removed from the pi-mode fields of the anode vane structure. It was also placed on the inside of the wall separating the inner interaction structure from the surrounding stabilizing cavity resonator. This inside placement has the advantage of removing the lossy material from much of the field of the circular-electric mode of the stabilizing cavity although the patent does not describe this result.

U.S. Pat. No. 3,169,211 issued Feb. 9, 1965 to J. Drexler et al., and U.S. Pat. No. 3,471,744 issued Oct. 7, 1969 (both assigned to the assignee of the present application) teach improvements in the slot-mode absorber described by Collier, particularly in cooling the lossy material.

U.S. Pat. Nos. 3,231,781 issued Jan. 25, 1966 to M. F. Liscio, 3,412,284 issued Nov. 19, 1968 to G. E Glenfield and 3,479,556 issued Nov. 18, 1969 to A. W. Cook (all assigned to the assignee of the present invention) disclose inverted coaxial magnetrons with the CEM cavity surrounded by the cathode-anode structure. In each of these the slot-mode absorber was positioned outside the separating wall in the chamber occupied by the anode vane structure. Thus the structure of Collier had simply been turned inside-out with no change in the relative positions of the elements.

In all these prior-art tubes the slot-mode absorber was inside the vacuum envelope. This required that the absorber be of material compatible with high vacuum and high-temperature bakeout. It could be a metal such as iron, which provided insufficient loss, or a lossy ceramic which introduced problems in extracting the heat generated in it. Also, some lossy ceramics such as porous alumina impregnated with carbon are very difficult to outgas. A final disadvantage is that it is hard to make a heat conducting contact to lossy ceramics in a vacuum.

These prior-art slot-mode absorbers succeeded in preferentially loading the slot modes because these modes have a great deal of their energy stored in or very near the slots themselves. However, the cavity mode was also loaded somewhat because some cavity field penetrated to the lossy material.

SUMMARY OF THE INVENTION

A feature of the present invention is the provision of a conductive shield between the slot-mode absorber and the main volume of the cavity to prevent penetration of cavity-mode fields into the absorber.

Another feature of the invention is the spacing of the shield far enough from the slots that the localized fields of the slot modes have largely fallen off at the shield position. Thus the shield does not short-circuit the slot-mode fields and prevent them from penetrating the absorber to lose their energy.

Anoher feature of the invention is a conductive connection of the shield to the conductive wall of the stabilizing cavity at a position removed from the slots so that the connection does not short-circuit the slot fields. This connection helps cool the shield.

With the shield of the present invention, the slot-mode absorber may be located on the cavity side of the slots instead of the anode side as in the prior art. This is of particular advantage in tubes where the stabilizing cavity is not part of the vacuum envelope, because the absorber is freed from the requirements of compatibility with a high-vacuum environment.

DESCRIPTION OF THE PREFERRED EMBODIMENTS

The invention will first be described as embodied in a so-called "sleeve magnetron" in which the coaxial stabilizing cavity is outside the vacuum envelope. The utility of the invention is by no means limited to such a tube, since it could be used in any device wherein a low-Q generating circuit is coupled by an iris to a high-Q stabilizing cavity.

FI. 1 shows a sleeve magnetron. The electron-interaction elements are contained in a vacuum envelope subassembly 6 which is interchangeably mounted in a stabilizing cavity subassembly 8. With this configuration the large cavity subassembly 8 need not be evacuated. Its materials and construction are not limited by high-vacuum considerations, so it can be made of lightweight material such as aluminum. Also, motion of the cavity tuner 9 does not require flexible metal bellows as vacuum seals.

Figure 1:
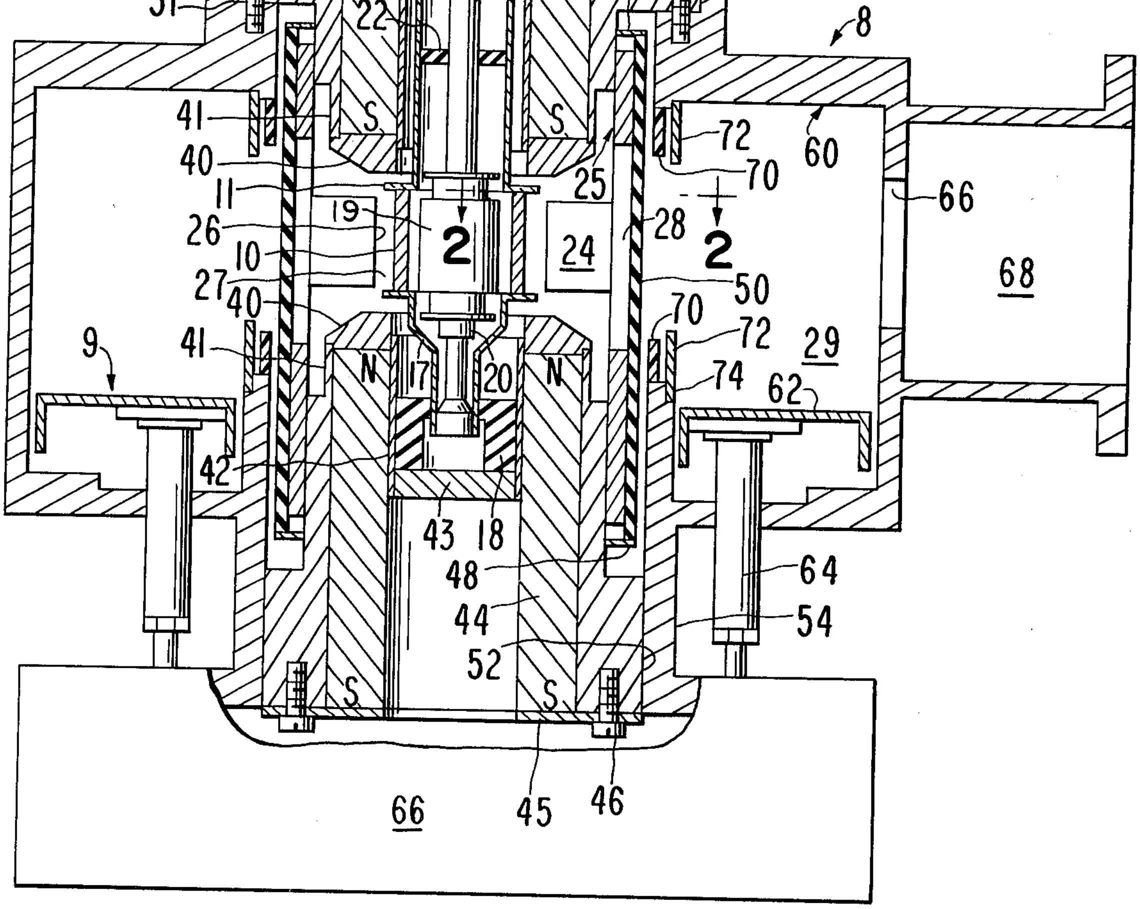
FIG. 1 is a section through the axis of a magnetron embodying the invention.
Figure 2:
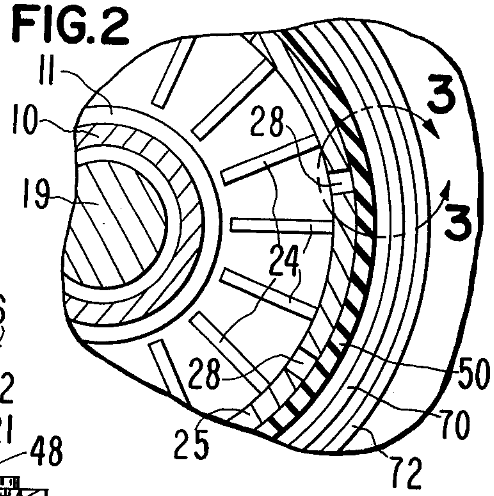
FIG. 2 is a partial section perpendicular to the axis of the magnetron of FIG. 1.

The magnetron of FIG. 1 and FIG. 2 has a cylindrical cathode emitter 10 as of tungsten impregnated with barium aluminate. At each end of emitter 10 is a projecting cathode end-hat 11 of non-emitting material such as molybdenum. The cathode is supported at one end on a cathode stem structure 12 which is mounted on the body 13 of the magnetron via an insulating seal 14 as of alumina ceramic, sealed at each end, as by brazing, to thin metallic lips 15, 16 as of iron-nickel-cobalt alloy. At the other end cathode 10 is suppoted by an extended support stem 17 slidably contained against motion transverse to its axis in a ceramic sleeve 18 which is in turn contained within tube body structure 13.

Cathode emitter 10 is heated by a radiant heater 19, as of cermet, mounted on current-carrying leads 20, 21. Lead 20 is joined, as by spotwelding, to cathode stem 17. Lead 21 is centered in cathode stem 12 by a disc-shaped ceramic insulator 22 and extends through the vacuum envelope via a coaxial ceramic seal 23 which insulates lead 21 from cathode stem 12.

Surrounding emitter 10 is a coaxial circular array of anode vanes 24 as of copper, extending inward from a cylindrical anode wall 25, also of copper. The inner ends 26 of vanes 24 lie on a cylinder defining the outer wall of a toroidal interaction spaced 27. Vanes 24 are regularly spaced circumferentially to define, between adjacent vanes, cavities resonant at approximate;ly the desired frequency of oscillation.

The outside wall of alternate cavities, axial slots 28 are cut through anode cylinder 25, to couple to the coaxial toroidal stabilizing cavity 29.

Axially displaced on opposite sides of emitter 10 and vanes 24 are coaxial ferromagnetic polepieces 40, as of mild steel, sealed at their outside radii, as by brazing, to tubular extensions 41 of non-magnetic tube body 13. Polepices 40 are sealed at their insides to coaxial thin-walled non-magnetic tubes 42, which in turn are sealed to end rings 43, as of austenitic steel, which complete the vacuum envelope and support the cathode structure.

Hollow cylindrical permanent magnets 44 are positioned in the annular spaces between tubes 41 and 42, preferably after the tube has been evacuated and baked. Magnets 44 are held in place by cover plates 45 and screws 46. Magnets 44 are magnetized axially before positioning in the tube and are oriented so that opposite poles are presented to the opposite ends of interaction space 27 and a generally uniform, generally axial magnetic field is produced in interaction space 27. Magnets 44 and polepieces 40 constitute the entire magnetic circuit. All other lrge parts are of non-magnetic material.

In operating the magnetron, alternating heater current is passed between heater lead 21 and cathode lead 15. Voltage is applied to cathode lead 15, pulsed negative with respect to the grounded tube body and anode vanes 24. Electrons are drawn from cathode emitter 10 toward vanes 24 and are directed by the crossed magnetic field into paths circulating around the toroidal interaction path 27 where they interact with fringing microwave electric fields of the inter-vane cavities and generate microwave energy.

The vacuum envelope is completed by thin metal flanges 48, as of iron-nickel-cobalt alloy, brazed to tube body 13 and to the ends of a dielectric cylindrical window 50 closely surrounding anode cylinder 25 so that the coupling slots 28 in cylinder 25 provide electromagnetic coupling, through window 50, between anode vanes 24 and the external stabilizing cavity 29. The outer surface of envelope 13 has mounting flanges 51, 52 which fit slidably in lips 53, 54 of the wall 60 of cavity subassembly 8.

Cavity subassembly 8 is not part of the vacuum envelope, so is construction is not limited to the materials and processes suitale for evacuated devices. For example cavity walls 60 may be made of aluminum, thereby saving weight. The resonant cavity 29 is tuned by axial motion of tuner 9 comprising an annular metallic disc 62 mounted on a plurality of rods 64, moved axially by a drive mechanism 66, shown schematically. Stabiizing cavity 29 is coupled by an iris 66 to an output waveguide 68 which may be coupled to the useful load.

Slots 28 serve as coupling between the anode circuit (vanes 24 and wall 25) and stabilizing cavity 29. The electromagnetic fields associated with this coupling are described in aforementioned U.S. Pat. No. 2,854,603. The coupling is sufficiently strong that the resonant frequency of high-Q cavity 29 controls the frequency of oscillation, and tuning cavity 29 by tuner 9 changes the frequency accordingly.

Slots 28 are depicted as of uniform width, rectangular cross-section. They may, however, be of other shapes, such as a slit of non-uniform width or a pair of holes connected by a short slot. Whatever their shape, slots 28 have their own set of resonant modes, in which a large part of the energy is stored in the slots themselves. The fields of these slot modes are only weakly coupled to cavity 29, so the slot modes are not damped by the output loading of cavity 29. The slot modes are however coupled to vanes 24 and thus can present a high impedance to the electrons, producing spurious oscillations.

As one example of the invention, a ring 70 of material having high rf loss is positioned near an end of slots 28. A ring at each end as in FIG. 1 may be even better. Ring 70 is placed quite close to the ends of slots 28 so that the fringing fields of the slot modes penetrate the lossy material, reducing the resonant impedance of the modes to damp out oscillations. In the tube shown in FIG. 1 the lossy material is outside the vacuum envelope, so it may be a porous ceramic impregnated with carbon, epoxy resin loaded with iron particles, or any other known highloss material. The lossy material may alternatively be inside the vacuum, and there is some advantage in having it inside wall 25 where it is less coupled to cavity fields. When inside the vacuum envelope, the material must be compatible with a sealed-off tube vacuum. Materials such as silicon carbide or a boron ceramic loaded with silicon carbide particles are suitable, although the aforementioned porous ceramic impregnated with carbon has been widely used in spite of its large evolution of gas.

Rings 70 are mounted as by cement on the wall 60 of cavity subassembly 8. Rings 70 overlap the ends of slots 28 and extend beyond the ends for a short distance to interact with the fringing end fields of slots 28.

Figure 3:
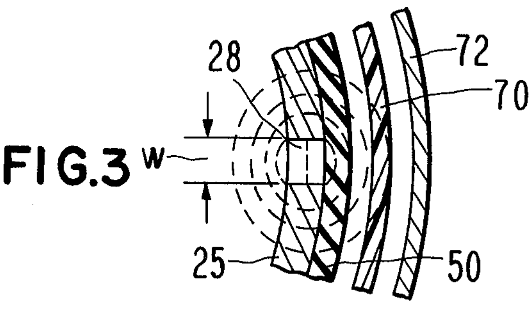
FIG. 3 is an enlarged portion of FIG. 2 showing rf electric field of a slot mode.

FIG. 3 shows the general shape of the electric field of a slot resonance. The field strength falls off rapidly (approximately inversely) with distance from the slot. The distance at which it has fallen to a given fraction of its value within the slot is proportional to the slot width $w$. For maximum loading of the slot modes, lossy ring 70 thus should be within a few slot-widths of anode cylinder 25.

Rings 70 are within the walls of cavity 29. By themselves, they would couple to the cavity fields and load the resonance. To prevent harmful loading, cylindrical conductive shields 72 are positioned between rings 70 and the interior of the cavity. Shields 72 overlap the axial extent of rings 70. They are close enough to rings 70 to reduce any fringing fields from the circular-electric-field cavity mode which penetrate to lossy rings 70, to a tolerable value. However, all cavity modes other than CEM modes have radial and/or axial components of electric field and wall currents, which will couple to the shielded lossy rings 70. The slot-mode absorber of FIG. 1 thus has the added advantage of damping unwanted cavity modes.

Shields 72 must not be so close to anode cylinder 25 that they short-circuit the slot-mode fields. They should thus be preferably a few slot-widths away, and certainly no closer than the slot width $w$. In an early abandoned experiment a shield somewhat like 72 was placed directly on a thin lossy member somewhat like 70, but no appreciable loading of slot modes was observed. However, lossy ring 70 could no doubt be made thicker to extend outward to contact shield 72 as long as the inside of ring 70 is close enough to anode cylinder 25 and shield 72 is far enough away.

Shield rings 72 are conductively joined to the walls 60 of cavity 29 for mechanical support and thermal conduction. The points of joining 74 are preferably beyond the ends of slots 28 so as not to shield the fields fringing from the slot ends. Again, the distance from the slots should be greater than the slot width.

Figure 4:
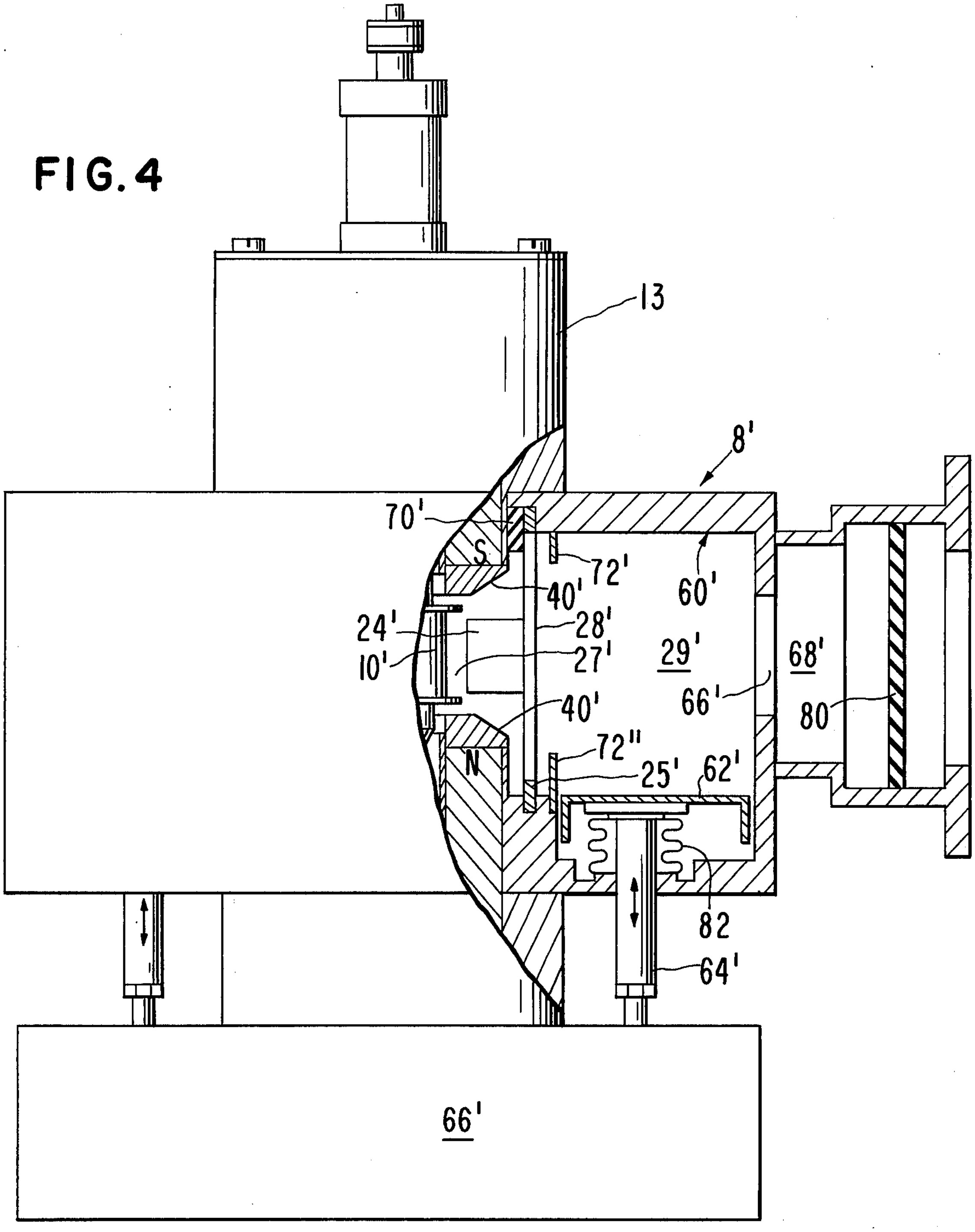
FIG. 4 is a partial section thru the axis of an alternate embodiment of the invention.

FIG. 4 illustrates the embodiment of the invention in a more conventional coaxial magnetron. Here the walls 60' of the stabilizing cavity 8' are part of the vacuum envelope. The output waveguide 68' contains a vacuum window 80 as of alumina ceramic. Tuner push-rods 64' transmit motion thru the envelope via flexible metallic bellows 82.

In the tube of FIG. 4 mode absorber 70' is within the vacuum. In this example it is placed on the inner, vane structure side of the common wall 25', to provide further shielding from cavity fields. Only one absorber 70' is shown, although a second absorber at the other end of slots 28' may be used. Shields 72' and 72" are supported on the cavity walls, spaced from slots 28' and overlapping the slot ends. Applicants have found that a second shield 72" at the end of slots 28' which are not coupled to a slot-mode absorber further increases the Q of the cavity. We believe this benefit is due to making the CEM fields more symmetric about their central plane and coupling cavity currents to the vanes 24' rather than the ends of slots 28'.

Many other embodiments of the invention will be obvious to those skilled in the art. The described embodiments are intended to be illustrative and not limiting. The scope of the invention is defined by the following claims and their legal equivalents.

We claim:

1. In an electronic oscillator:

circuit means adapted to interact with electrons at a selected frequency to generate electromagnetic energy, cavity means adapted to resonate at said frequency, a conductive wall forming a common part of the electrical boundaries of said circuit means and said cavity means, at least one slot in said wall for coupling electromagnetic fields of said circuit means and said cavity means, lossy material near said slot, a conductive shield between said lossy material and the interior of said cavity means for shielding said lossy material from fields of said cavity means, the portion of said shield near said slot being spaced from said wall by a distance larger than the width of said slot.

2. The oscillator of claim 1 wherein said slot is in a cylindrical portion of said wall.

3. The oscillator of claim 3 wherein said slot extends parallel to the axis of said cylinderical portion.

4. The oscillator of claim 3 wherein said cavity means includes a toroidal cavity and said cylindrical portion forms at least a part of the inner wall of said cavity.

5. The oscillator of claim 3 wherein said cavity means includes a cylindrical cavity and said cylindrical portion forms at least a part of the cylindirical wall of said cavity.

6. The oscillator of claim 1 wherein said shield is conductively joined to a wall of said cavity at a distance from said slot larger than the width of said slot.

7. The oscillator of claim 1 including a plurality of slots in said wall.

8. The oscillator of claim 4 including a plurality of slots in said cylindrical portion parallel to said axis.

9. The oscillator of claim 1 wherein said oscillator is a coaxial magnetron comprising a vacuum envelope.

10. The magnetron of claim 9 wherein said circuit means and said wall are within or part of the vacuum envelope and wherein substantially the remainder of said cavity means except said wall is outside the vacuum envelope.

11. The magnetron of claim 10 wherein said lossy material is outside said vacuum envelope.

12. The magnetron of claim 10 wherein said vacuum envelope is removable from said remainder of said cavity means.

13. The magnetron of claim 10 wherein said lossy material is inside said vacuum envelope.

14. The magnetron of claim 13 wherein said lossy material is inside said wall.

* * * * *